United States Patent [19]

Baehne

[11] 4,167,772
[45] Sep. 11, 1979

[54] CIRCUIT BOARD MOUNTING MEANS

[75] Inventor: James R. Baehne, Reseda, Calif.

[73] Assignee: Pertec Computer Corporation, El Segundo, Calif.

[21] Appl. No.: 910,092

[22] Filed: May 30, 1978

Related U.S. Application Data

[63] Continuation of Ser. No. 728,270, Sep. 30, 1976, abandoned.

[51] Int. Cl.² .................. H05K 7/12; H05K 7/04; F16B 19/00
[52] U.S. Cl. .................... 361/399; 24/97; 24/100; 24/212; 85/3 R; 174/138 D
[58] Field of Search .............. 174/138 D, 158 R; 361/397, 398, 399, 400, 403, 412, 417, 418, 419, 420; 24/97, 100, 212; 85/3 R, 3 K, 3 S, 8.1, 8.3; 248/201, 500

[56] References Cited

U.S. PATENT DOCUMENTS

| | | | |
|---|---|---|---|
| 1,490,250 | 4/1924 | Wettergren | 24/100 |
| 1,650,454 | 11/1927 | Langan | 85/3 R |
| 2,287,117 | 6/1942 | Montalto | 85/3 R X |
| 3,162,723 | 12/1964 | McCurtain | 174/158 R X |
| 3,705,442 | 12/1972 | Sygnator | 174/138 D X |
| 3,947,984 | 4/1976 | Winrow | 174/138 D X |

FOREIGN PATENT DOCUMENTS

| | | | |
|---|---|---|---|
| 84552 | 6/1921 | Austria | 85/3 R |
| 843929 | 8/1960 | United Kingdom | 24/212 |

Primary Examiner—Laramie E. Askin
Attorney, Agent, or Firm—Freilich, Hornbaker, Wasserman, Rosen & Fernandez

[57] ABSTRACT

Mounting means for removably securing a circuit board in a fixed spaced relationship to a base plate. The mounting means includes one or more fasteners, each comprised of a spacer member and a latch member. The spacer member includes a disk-like portion having a first flat surface for securement against the base plate and a second flat surface on which the circuit board is supported. A post extends from the disk-like portion second flat surface through an opening in the circuit board. The latch member is mounted for movement on the post between a first position which allows it to pass through the circuit board opening and a second position in which it is locked against one surface of the circuit board forcing the opposite circuit board surface against the disk-like portion second flat surface.

5 Claims, 5 Drawing Figures

CIRCUIT BOARD MOUNTING MEANS

BACKGROUND AND SUMMARY OF THE INVENTION

This is a continuation of application Ser. No. 728,270, filed Sept. 30, 1976, now abandoned.

This invention relates to mounting means suitable for securing a first plate, such as an electronic circuit board, in fixed spaced relationship to a second plate, such as a metal chassis base plate.

The prior art is replete with various systems and structures suitable for mounting circuit boards on base plates. The present invention is directed to an improved mounting means which consumes relatively little circuit board area and which permits the circuit board to be easily removed from the mounting means without tools. Moreover, mounting structures provided in accordance with the invention are relatively simple in construction and can be inexpensively fabricated employing readily known plastic molding techniques.

Briefly, a fastener is provided in accordance with the invention comprised of a spacer member and a latch member. The spacer member includes a disk-like portion having a first flat surface for securement against a base plate. A post extends from the disk-line portion second flat surface and is intended to be received through an opening in a circuit board. Said latch member is pivotable on said post between a first position which allows it to pass through the circuit board opening and a second position which enables it to bear against the circuit board, forcing it against said disk-line portion second flat surface.

In accordance with a preferred embodiment of the invention, the latch member has an elongated slot formed therein which permits it to move linearly, as well as to pivot, with respect to a pivot pin carried by said post. A detent recess is formed in said latch member contiguous with said slot for receiving said pivot pin to prevent said linear movement.

In accordance with a feature of the preferred embodiment, a cam surface is formed on the latch member adapted to bear against the circuit board to force it against the disk-like portion second flat surface as the latch member is pivoted to said second position.

In use, one or more fasteners are preferably employed in conjunction with separate support members attached to the base plate and against which the circuit board bears. The support members and disk-like portions are preferably dimensioned relative to one another such that the support member supporting surface is spaced further from the base plate than the disk-like portion second flat surface so as to lightly spring the circuit board when the latch member is pivoted to said second position.

DESCRIPTION OF A PREFERRED EMBODIMENT

The present invention is directed to means particularly suited for mounting an electronic circuit board 10 (FIG. 4) on, but spaced from, a base plate 12. The base plate 12, in a typical situation, comprises a cover or bottom portion of a metal chassis, thus requiring that the mounting means electrically insulate the circuit board 10 from the base plate 12. Inasmuch as the area or "real estate" of a circuit board is limited, it is a further objective that the mounting means occupy or waste as little circuit board area as feasible. Further, since it is frequently necessary to remove the circuit board for servicing, it is a further objective that the mounting means be configured so as to enable the circuit board to be quickly mounted on and removed from the mounting means, preferably without the use of tools. Still further, it is desirable to be able to mount the circuit board on the base plate in a manner so as to avoid any parts protruding beyond the opposite surface of the base plate. The present invention is directed to a relatively simple structure which is capable of achieving the foregoing objectives and in addition is capable of being manufactured by relatively low-cost plastic molding techniques.

Figure 1:
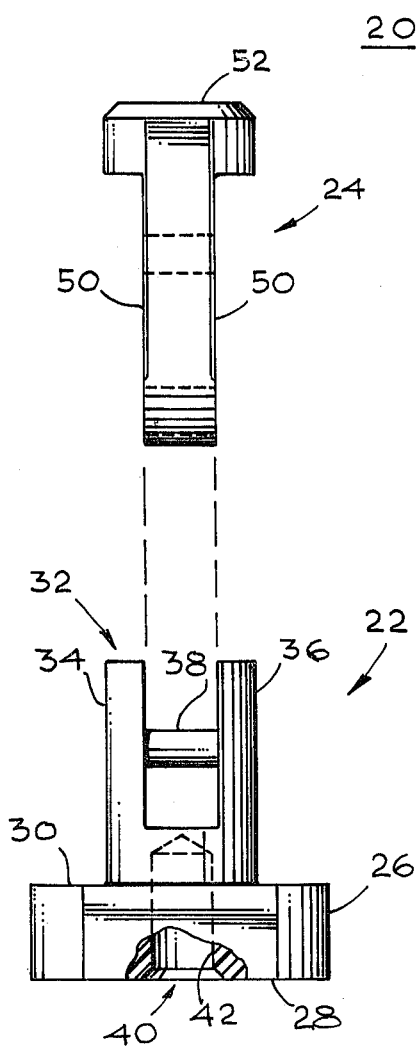
FIG. 1 is a front elevational view showing disassembled the members of a fastener in accordance with the preferred embodiment of the invention.
Figure 2:
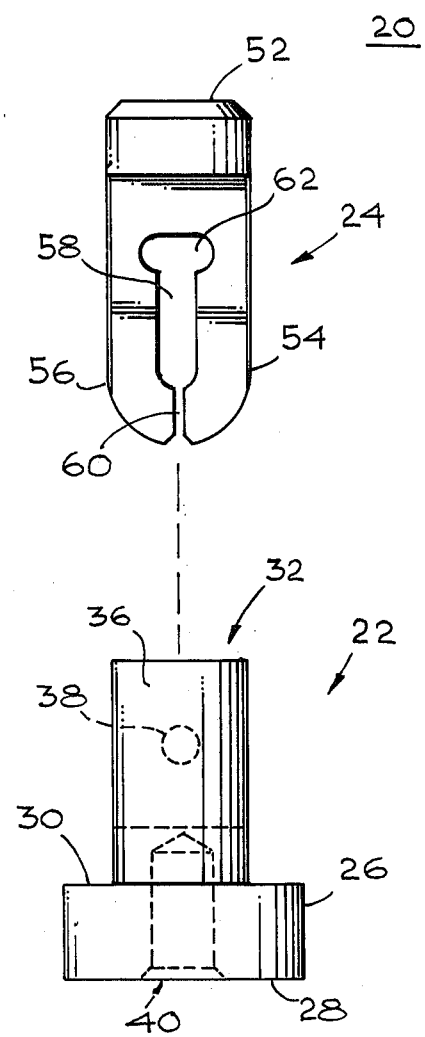
FIG. 2 is a side elevational view showing disassembled the members of a fastener in accordance with the preferred embodiment of the invention.

The mounting means in accordance with the present invention comprises a fastener 20, shown disassembled in FIGS. 1 and 2. The fastener 20 is comprised of a spacer member 22 and a latch member 24.

The spacer member includes a disk-like portion 26 having a first or lower substantially flat surface 28 and a second or upper substantially flat surface 30. Extending perpendicularly from the surface 30 is a bifurcated post 32 consisting of spaced legs 34 and 36 carrying a pivot pin 38 therebetween. A central opening 40 is formed in the flat surface 28 opening into a screw hole 42.

The spacer member is intended to be secured to the cover plate 12 with the flat surface 28 of the spacer member 22 engaged against the upper surface of the base plate 12. A screw 46 extends through a hole in the base plate 12 and is threaded into the screw hole 42 for securing the spacer member 22 to the base plate. The screw 46 preferably has a flat head so as not to protrude beyond the underside of base plate 12.

The latch member 24 is elongated and includes a substantially flat portion 50 and head portion 52. The flat portion 50, as shown in FIG. 2, is comprised of spaced legs 54 and 56 which depend from the head portion 52 and define an elongated slot 58 therebetween. The elongated slot 58 narrows at a first end to a thin passageway 60. At the opposite end, the slot 58 opens into a contiguous dual lobe detent recess 62. The latch member is preferably fabricated of an appropriate plastic material so that the legs 54 and 56 can exhibit limited resilient movement relative to one another so as to enable the pivot pin 38 of the spacer member 22 to pass through the narrow passageway 60 into the elongated slot 58. The legs 54 and 56 of the latch member are sufficiently resilient so that once the pivot pin 38 has been passed through the passageway 60 into the slot 58, the legs will move toward each other to thereby retain the latch member on the pivot pin 38.

Figure 4:
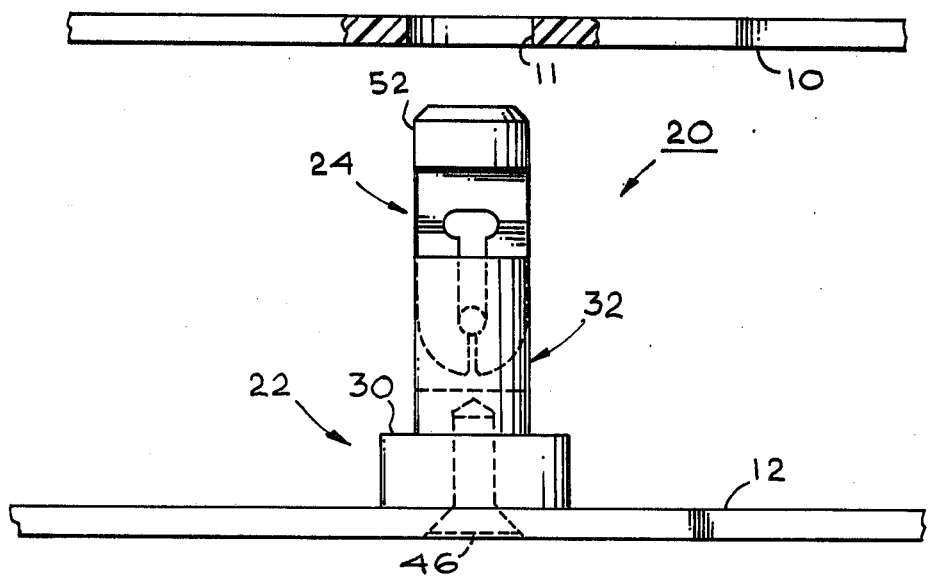
FIG. 4 is a schematic illustration showing a circuit board being installed on a base plate.

With the latch member 24 mounted on the pivot pin 38, the latch member can be pivoted to a first position, as represented in FIG. 4, in which the latch member 24 extends substantially in line with the elongation of the bifurcated post 32. In this first pivotal position, the opening 11 in the circuit board 10 is able to pass over the head 52 of the latch member to thereby enable the board 10 to be brought close to the upper surface 30 of the spacer member 22. The latch member 24 can then be pivoted by 90° to the orientation shown in FIG. 5, and then be slid to the right in the direction represented by arrow 66 to move the pivot pin 38 into alignment with the detent recess 62. Entry of the pivot pin 38 into either lobe of the detent recess restricts the further linear movement of the latch member and thus prevents the latch member from pivoting to the unlatched position of FIG. 4.

Figure 3:
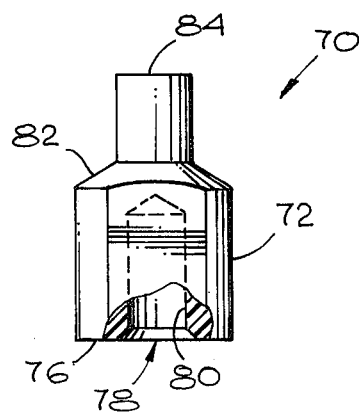
FIG. 3 is a front elevational view of a support member in accordance with the present invention.
Figure 5:
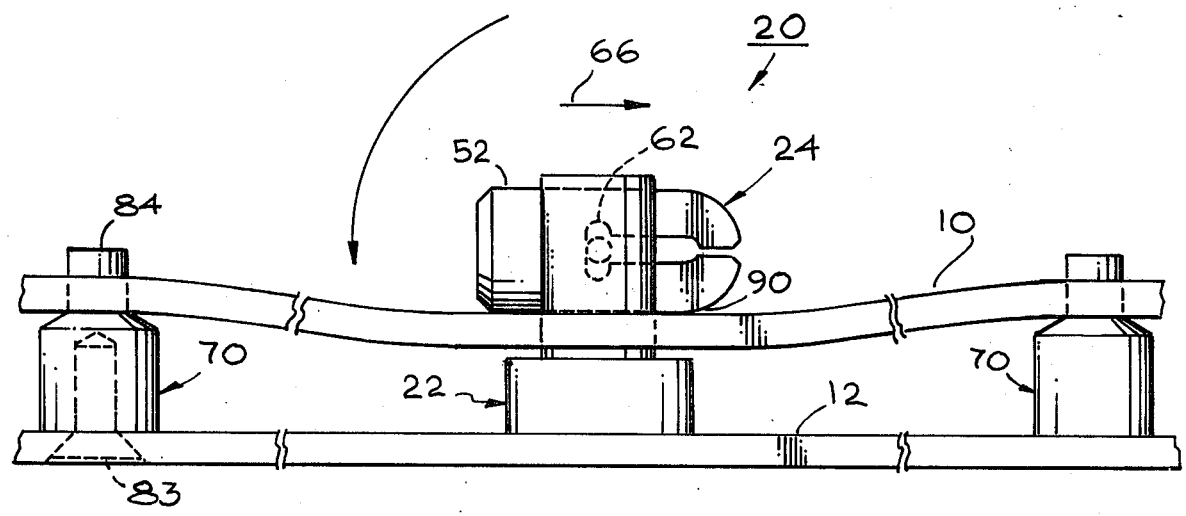
FIG. 5 is a schematic illustration showing a circuit board latched to a base plate.

In the preferred mounting system depicted in FIG. 5, the fastener 20 is used in conjunction with a plurality of support members 70. Each support 70 (FIG. 3) comprises a wide cylindrical base portion 72 having a lower surface 76 adapted to be secured against the upper surface of base plate 12. An opening 78 is formed in the support member surface 76 opening into a screw hole 80 capable of receiving flat-head screw 83 for securing the support member 70 to the base plate 12. The support member 70 further includes a tapered shoulder portion 82 formed between the cylindrical portions 72 and a reduced single post 84. The post 84 is intended to pass through locating holes formed within the circuit board 10.

The support members 70 are dimensioned relative to the disk-like portion 26 of the spacer member so as to normally hold the flat board 10 above and spaced from the disk-like portion upper surface 30 when the fastener is unlatched. Rotation of the fastener latch member 24 to the latch position as depicted in FIG. 5, however, lightly springs the board forcing it downwardly on the tapered shoulder portions 82 of the support members 70 toward the surface 30 of the disk-like portion 26. In order to easily spring the board in the fashion depicted in FIG. 5, a cam surface 90 is formed proximate to the free ends of the legs 54 and 56 of the latch member 24. The cam surface 90 has a radius of curvature such that as the latch member is pivoted from the first or vertical position depicted in FIG. 4 to the second or horizontal position depicted in FIG. 5, the spacing between the latch member cam surface 90 and the upper surface 30 of the support member 22 is reduced to thereby lightly flex the board. This flexure or springing of the board forces the bottom lobe of the detent recess of the latch member upward to accommodate the pivot pin 38 as depicted in FIG. 5, thus locking the latch member from movement.

The spacer member 22, latch member 24, and support member 70 can all be formed of inexpensive plastic material and fabricated by inexpensive plastic processing techniques, such as molding. From the foregoing, it should now be appreciated that an improved mounting means has been disclosed herein particularly suitable for removably securing a circuit board in fixed spaced relationship to a base plate. The disclosed mounting means, when fabricated of a dielectric material such as plastic, electrically insulates the circuit board from the base plate. Further, the fasteners and support members, when constructed in accordance with the preferred embodiment of the invention illustrated, leave the underside of the base plate free of any protrusions thereby permitting units utilizing the disclosed mounting means to be stacked close together.

Although a particular embodiment of the invention has been described and illustrated herein, it is recognized that modifications and variations may readily occur to those skilled in the art and consequently, it is intended that the claims be interpreted to cover such modifications and equivalents.

I claim:

1. In combination with a circuit board and base plate, mounting means securing said circuit board in spaced relationship with respect to said base plate, said mounting means comprising:

fastener means including a latch member and a spacer member;

said spacer member including a disk-like portion having a lower surface secured to said base plate, an upper surface adapted to support said circuit board and a post extending perpendicularly from said upper surface;

means supporting said latch member on said post for movement between a first position substantially parallel to said post and a second position substantially perpendicular to said post;

detent means for detenting said latch member in said second position;

first and second support members each having a lower surface secured to said base plate and an upper surface removably supporting said circuit board, each support member upper and lower surfaces being spaced by a distance greater than the distance between said spacer member upper and lower surfaces, said first and second support members being respectively spaced in opposite directions from said fastener means;

a first hole formed in said circuit board receiving said post and latch member therethrough; and cam means carried by said latch member for bearing against the upper surface of said circuit board as said latch member is moved from said first to said second position to thus force said circuit board toward said disk-like portion upper surface.

2. The combination of claim 1 wherein said supporting means includes a pivot pin carried by said post and wherein said latch member includes an elongated slot threading said pivot pin whereby said latch member can both pivot and move linearly with respect to said pivot pin; and wherein said detent means comprises a recess formed contiguous with and extending substantially perpendicular to said slot for receiving said pin to restrict linear movement of said latch member.

3. The combination of claim 1 wherein said fastener means is formed of electrically insulative material.

4. The combination of claim 1 including screw means extending through said base plate and respectively threaded into said fastener means spacer member and each support member for securing them against a first surface of said base plate, said screw means configured so as to not protrude beyond a second surface of said base plate.

5. The combination of claim 1 wherein each support member upper surface comprises a tapered shoulder.

* * * * *